(12) United States Patent
Nguyen et al.

(10) Patent No.: US 8,026,178 B2
(45) Date of Patent: Sep. 27, 2011

(54) PATTERNING METHOD FOR HIGH DENSITY PILLAR STRUCTURES

(75) Inventors: Natalie Nguyen, San Jose, CA (US); Paul Wai Kie Poon, Fremont, CA (US); Steven J. Radigan, Fremont, CA (US); Michael Konevecki, San Jose, CA (US); Yung-Tin Chen, Santa Clara, CA (US); Raghuveer Makala, Sunnyvale, CA (US); Vance Dunton, San Jose, CA (US)

(73) Assignee: SanDisk 3D LLC, Milpitas, CA (US)

( * ) Notice: Subject to any disclaimer, the term of this patent is extended or adjusted under 35 U.S.C. 154(b) by 0 days.

(21) Appl. No.: 12/686,217

(22) Filed: Jan. 12, 2010

(65) Prior Publication Data

US 2011/0171815 A1 Jul. 14, 2011

(51) Int. Cl.
*H01L 21/311* (2006.01)
(52) U.S. Cl. ........ 438/702; 438/947; 438/948; 438/949; 257/E21.023
(58) Field of Classification Search ................ 438/128, 438/129, 131, 132, 478, 488, 491, 947–949; 257/E21.023, E21.026, E21.038, E21.039, 257/E21.582, E21.232
See application file for complete search history.

(56) References Cited

U.S. PATENT DOCUMENTS

| | | | |
|---|---|---|---|
| 4,201,800 A | 5/1980 | Alcom et al. | |
| 5,024,971 A | 6/1991 | Baker et al. | |
| 5,482,885 A | 1/1996 | Lur et al. | |
| 5,652,084 A | 7/1997 | Cleeves | |
| 5,667,940 A | 9/1997 | Hsue et al. | |
| 5,739,068 A | 4/1998 | Jost et al. | |
| 5,915,167 A | 6/1999 | Leedy | |
| 5,977,638 A | 11/1999 | Rodgers et al. | |
| 6,055,180 A | 4/2000 | Gudesen et al. | |
| 6,140,234 A | 10/2000 | Uzoh et al. | |
| 6,221,562 B1 | 4/2001 | Boyd et al. | |
| 6,420,231 B1 | 7/2002 | Harari et al. | |
| 6,423,474 B1 | 7/2002 | Holscher | |
| 6,492,075 B1 | 12/2002 | Templeton et al. | |
| 6,664,028 B2 | 12/2003 | Hwang et al. | |

(Continued)

FOREIGN PATENT DOCUMENTS

EP 0 288 739 A2 11/1988

(Continued)

OTHER PUBLICATIONS

U.S. Appl. No. 09/560,626, filed Apr. 28, 2000, Knall.

(Continued)

*Primary Examiner* — Alexander Ghyka
*Assistant Examiner* — Leonard Chang
(74) *Attorney, Agent, or Firm* — The Marbury Law Group, PLLC

(57) ABSTRACT

A method of making a device includes forming a first photoresist layer over a sacrificial layer, patterning the first photoresist layer to form first photoresist features, rendering the first photoresist features insoluble to a solvent, forming a second photoresist layer over the first photoresist features, patterning the second photoresist layer to form second photoresist features, forming a spacer layer over the first and second photoresist features, etching the spacer layer to form spacer features and to expose the first and second photoresist features, forming third photoresist features between the spacer features, removing the spacer features, and patterning the sacrificial layer using the first, second and third photoresist features as a mask to form sacrificial features.

16 Claims, 13 Drawing Sheets

U.S. PATENT DOCUMENTS

| | | | |
|---|---|---|---|
| 6,853,049 | B2 | 2/2005 | Herner |
| 6,855,614 | B2 | 2/2005 | Metzler |
| 6,946,719 | B2 | 9/2005 | Petti et al. |
| 6,952,030 | B2 | 10/2005 | Herner et al. |
| 7,078,348 | B1 | 7/2006 | Singh et al. |
| 7,081,377 | B2 | 7/2006 | Cleeves |
| 7,176,064 | B2 | 2/2007 | Herner |
| 7,211,866 | B2 | 5/2007 | Yuan et al. |
| 7,271,057 | B2 | 9/2007 | Eppich |
| 7,514,204 | B2 | 4/2009 | Hatakeyama et al. |
| 2002/0052068 | A1 | 5/2002 | Juengling |
| 2002/0172901 | A1 | 11/2002 | Tokushima |
| 2003/0157436 | A1 | 8/2003 | Manger et al. |
| 2003/0178684 | A1 | 9/2003 | Nakamura |
| 2004/0245557 | A1 | 12/2004 | Seo et al. |
| 2005/0014385 | A1 | 1/2005 | Ghozeil et al. |
| 2005/0052915 | A1 | 3/2005 | Herner et al. |
| 2005/0170294 | A1 | 8/2005 | Kobayashi |
| 2005/0196684 | A1 | 9/2005 | Nakamura et al. |
| 2005/0226067 | A1 | 10/2005 | Herner et al. |
| 2006/0035167 | A1 | 2/2006 | Angelopoulos et al. |
| 2006/0105476 | A1 | 5/2006 | Choi et al. |
| 2006/0154182 | A1 | 7/2006 | Brodsky |
| 2006/0216937 | A1 | 9/2006 | Dunton et al. |
| 2006/0228895 | A1* | 10/2006 | Chae et al. ............ 438/725 |
| 2006/0250836 | A1 | 11/2006 | Herner et al. |
| 2006/0250837 | A1 | 11/2006 | Herner et al. |
| 2006/0273298 | A1 | 12/2006 | Petti |
| 2006/0292301 | A1 | 12/2006 | Herner |
| 2007/0048674 | A1 | 3/2007 | Wells |
| 2007/0049035 | A1 | 3/2007 | Tran |
| 2007/0072360 | A1 | 3/2007 | Kumar et al. |
| 2007/0099431 | A1 | 5/2007 | Li |
| 2007/0114509 | A1 | 5/2007 | Herner |
| 2007/0158688 | A1 | 7/2007 | Caspary et al. |
| 2007/0164309 | A1 | 7/2007 | Kumar et al. |
| 2007/0176160 | A1 | 8/2007 | Uchiyama et al. |
| 2007/0197014 | A1 | 8/2007 | Jeon et al. |
| 2007/0212886 | A1 | 9/2007 | Uh et al. |
| 2007/0212889 | A1 | 9/2007 | Abatchev et al. |
| 2007/0269746 | A1 | 11/2007 | Nakamura |
| 2008/0013364 | A1 | 1/2008 | Kumar et al. |
| 2008/0014533 | A1 | 1/2008 | Keller et al. |
| 2008/0085600 | A1 | 4/2008 | Furukawa et al. |
| 2008/0241736 | A1 | 10/2008 | Kobayashi et al. |
| 2008/0248654 | A1 | 10/2008 | Jung |
| 2009/0149026 | A1 | 6/2009 | Zhou et al. |

FOREIGN PATENT DOCUMENTS

| | | |
|---|---|---|
| EP | 1 818 977 A2 | 8/2007 |
| GB | 1 476 585 | 6/1977 |
| JP | 2008-83537 | 4/2008 |
| KR | 2007-0122049 | 12/2007 |
| WO | WO 2008/114644 A1 | 9/2008 |

OTHER PUBLICATIONS

U.S. Appl. No. 11/159,031, filed Jun. 22, 2005, Herner.
U.S. Appl. No. 11/864,205, filed Sep. 28, 2007, Yung-Tin Chen et al.
U.S. Appl. No. 11/864,532, filed Sep. 28, 2007, Maxwell.
U.S. Appl. No. 12/000,758, filed Dec. 17, 2007, Petti et al.
U.S. Appl. No. 12/007,780, filed Jan. 15, 2008, Herner et al.
U.S. Appl. No. 12/007,781, filed Jan. 15, 2008, Dunton et al.
U.S. Appl. No. 12/149,151, filed Apr. 28, 2008, Chen et al.
U.S. Appl. No. 12/216,107, filed Jun. 30, 2008, Chan.
U.S. Appl. No. 12/216,924, filed Jul. 11, 2008, Ping et al.
U.S. Appl. No. 12/222,293, filed Aug. 6, 2008, Chan.
U.S. Appl. No. 12/285,466, filed Oct. 6, 2008, Chung-Ming Wang et al.
Office Action mailed Jul. 22, 2009, received in U.S. Appl. No. 12/000,758.
Office Action mailed Jul. 28, 2009, received in U.S. Appl. No. 12/149,151.
Partial International Search Report mailed Oct. 21, 2009, in International application No. PCT/US2009/048584.
International Search Report and Written Opinion mailed Oct. 9, 2009, received in International application No. PCT/US2009/048581.
International Search Report and Written Opinion mailed Sep. 7, 2009, received in International application No. PCT/US2009/002400.
Kim, Ryoung H. et al., "Double Exposure Using 193 nm Negative Tone Photoresist", Optical Microlithography XX, Proc of SPIE, vol. 6520, 65202M, 2007, 8 pgs.
Nakamura, Hiroko et al., "Contact Hole Formation by Multiple Exposure Technique in Ultra-low $k_1$ Lithography", Optical Microlithography XVII, Proceedings of SPIE, vol. 5377, Feb. 24-27, 2004, pp. 255-263.
Nakamura, Hiroko et al., "Low $k_1$ Contact Hole Formation by Double Line and Space Formation Method with Contact Hole Mask and Dipole Illumination", The Japan Society of Applied Physics, vol. 45, No. 6B, 2000, pp. 5409-5417.
International Bureau of WIPO, International Preliminary Report on Patentability, Intl. Application PCT/US09/39124, Oct. 21, 2010, 11 pages.
International Bureau of WIPO, International Preliminary Report on Patentability, Intl. Application PCT/US09/02400, Nov. 11, 2010, 11 pages.
International Bureau of WIPO, International Preliminary Report on Patentability, Intl. Application PCT/US09/39121, Oct. 21, 2010, 10 pages.
Office Action mailed Mar. 30, 2009 received in U.S. Appl. No. 11/864,205.
Ishibashi, Takeo et al., "Advanced Micro-Lithography Process for i-line Lithography," Jpn. J. Appl. Phys. vol. 40, Part 1, No. 12, 2001, pp. 7156-7161.
International Search Report and Written Opinion mailed Jun. 8, 2009 in International Application No. PCT/US2009/039121.
International Search Report and Written Opinion mailed Jun. 8, 2009 in International Application No. PCT/US2009/039124.
Office Action mailed Jul. 8, 2009 in U.S. Appl. No. 12/216,107.

* cited by examiner

US 8,026,178 B2

PATTERNING METHOD FOR HIGH DENSITY PILLAR STRUCTURES

BACKGROUND OF THE INVENTION

The invention generally relates to a method of making a semiconductor device, and more particularly, to a method of making semiconductor pillar structures.

Devices made from semiconductor materials are used to create memory circuits in electrical components and systems. Memory circuits are the backbone of such devices as data and instruction sets are stored therein. Maximizing the number of memory elements per unit area on such circuits minimizes their cost. As the dimensions for structures formed on a semiconductor wafer diminish, tools currently available to create these devices reach their limits.

SUMMARY

One embodiment of the invention provides a method of making a device including forming a first photoresist layer over a sacrificial layer, patterning the first photoresist layer to form first photoresist features, rendering the first photoresist features insoluble to a solvent, forming a second photoresist layer over the first photoresist features, patterning the second photoresist layer to form second photoresist features, forming a spacer layer over the first and second photoresist features, etching the spacer layer to form spacer features and to expose the first and second photoresist features, forming third photoresist features between the spacer features, removing the spacer features, and patterning the sacrificial layer using the first, second and third photoresist features as a mask to form sacrificial features.

Another embodiment of the invention provides a method of making a device including forming a sacrificial layer over a semiconductor seed layer, forming a hard mask layer over the sacrificial layer, forming a first photoresist layer over the hard mask layer, patterning the first photoresist layer to form first photoresist features, rendering the first photoresist features insoluble to a solvent, forming a second photoresist layer over the first photoresist features, patterning the second photoresist layer to form second photoresist features, forming a spacer layer over the first and second photoresist features, etching the spacer layer to form spacer features and to expose the first and second photoresist features, forming third photoresist features between the spacer features, removing the spacer features, etching the hard mask layer using the first, second and third photoresist features as a mask to form hard mask features, trimming the hard mask features, etching the sacrificial layer using the hard mask features as a mask to form sacrificial features, etching the semiconductor seed layer using the sacrificial features as a mask, forming an insulating filler layer between the sacrificial features and between remaining portions of the etched semiconductor seed layer, removing the sacrificial features to form openings in the insulating filler layer, and forming semiconductor pillars in the openings over the remaining portions of the etched semiconductor seed layer.

Another embodiment of the invention provides a method of making a device including forming a hard mask layer over a sacrificial layer, forming a first photoresist layer over the hard mask layer, patterning the first photoresist layer to form first photoresist features, rendering the first photoresist features insoluble to a solvent, forming a second photoresist layer over the first photoresist features, patterning the second photoresist layer to form second photoresist features, etching the hard mask layer using both the first and the second photoresist features as a mask to form hard mask features, forming a spacer layer over the hard mask features, etching the spacer layer to form spacer features and to expose the hard mask features, forming third masking features between the spacer features, removing the spacer features, etching the sacrificial layer using the hard mask features and the third masking features as a mask to form sacrificial features, forming an insulating filler layer between the sacrificial features, and removing the sacrificial features to form openings in the insulating filler layer.

DETAILED DESCRIPTION OF THE PREFERRED EMBODIMENTS

One embodiment of the invention provides a method of making a device including forming a first photoresist layer over a sacrificial layer, patterning the first photoresist layer to form first photoresist features, rendering the first photoresist features insoluble to a solvent, forming a second photoresist layer over the first photoresist features, patterning the second photoresist layer to form second photoresist features, forming a spacer layer over the first and second photoresist features, etching the spacer layer to form spacer features and to expose the first and second photoresist features, forming third photoresist features between the spacer features, removing the spacer features, and patterning the sacrificial layer using the first, second and third photoresist features as a mask to form sacrificial features. The method may further comprise forming an insulating filler layer between the sacrificial features, and removing the sacrificial features to form openings in the insulating filler layer. The openings formed in the insulating filler layer can be pillar shaped, and at least some of the openings are cylindrical and others are quasi-cylindrical.

In some embodiments, the sacrificial layer comprises an inorganic hard mask material over an organic hard mask material. In these embodiments, the step of patterning the sacrificial layer using the photoresist features comprises etching the inorganic hard mask layer to form inorganic sacrificial features, trimming the inorganic hard mask sacrificial features, and etching the organic hard mask layer using the trimmed inorganic hard mask sacrificial features as a mask.

The openings formed in the insulating filler layer may be then filled by any desirable materials. For example the openings may serve as contact holes and be filled by conductive material, such as metal, silicide or polysilicon, which forms electrodes of an underlying device, such as a diode or transistor, or interconnects to lower level electrodes or metallization. In another embodiment, the openings may be filled by semiconductor material, resulting in pillar-shape semiconductor devices, such as pillar-shaped diodes.

FIGS. 1A through 1E show side cross-sectional views illustrating stages in formation of a device according to a method a first embodiment. FIGS. 2A through 2E show top views of the corresponding stages.

Figure 1B:
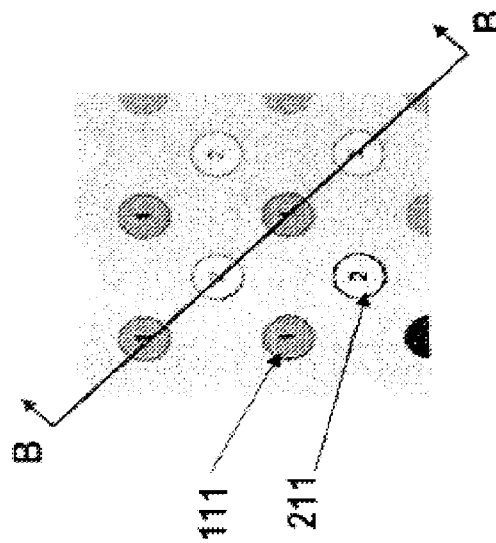
FIGS. 1A-1E are side cross-sectional views illustrating a process flow of one embodiment.
Figure 1A:
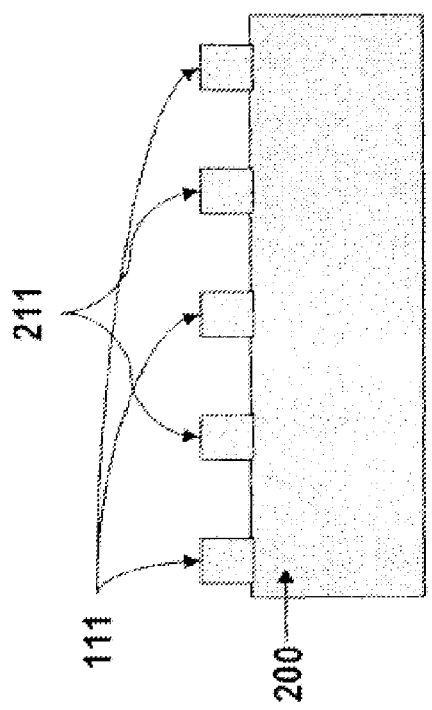
Figure 2B:
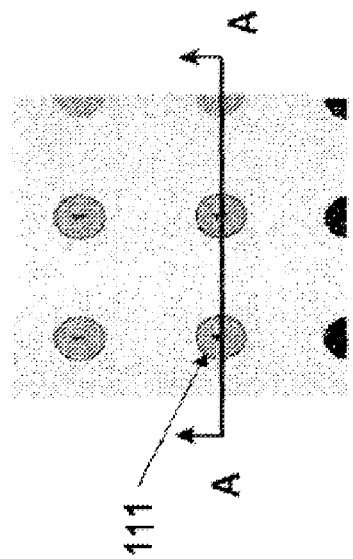
FIGS. 2A-2E are illustrative top views of the structures shown in FIGS. 1A-1E, respectively.
Figure 2A:
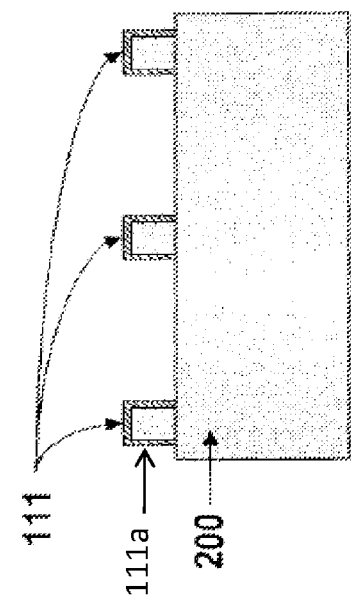

Referring to FIG. 1A, a first photoresist layer can be formed over a sacrificial layer 200, followed by patterning the photoresist layer to form first photoresist features 111. The first photoresist features 111 are pillar-shaped (e.g., cylindrical shaped pillar), as illustrated by circles 1 in FIG. 2A. FIG. 1A is a side cross sectional view along line A-A in FIG. 2A. Additional layers may be formed below, above or between layers 111 and 200 as will be described in more detail below.

The first photoresist features 111 are then rendered insoluble to a solvent used for forming more photoresist features between the first photoresist features 111. Any suitable methods can be used to render the first photoresist features 111 insoluble. For example, the methods described in U.S. patent application Ser. No. 11/864,205 and in U.S. patent application Ser. No. 12/216,107, which are incorporated by reference in their entirety, may be used. In some embodiments, the first photoresist features 111 may be rendered insoluble by applying a reactive reagent, causing the residual acids in the photoresist features 111 to chemically react with the reactive reagent to form a barrier layer or coating 111a on upper and side surfaces of the first photoresist features 111 (i.e., to "freeze" the first photoresist features 111). This barrier layer 111a can be formed by causing cross-linking on the surface of the pattern 111 or by any other suitable methods. The barrier layer 111a may comprise a thin polymer film having a thickness of less than 10 nm, preferably about 1-2 nm. This layer 111a is disposed on a surface of first photoresist features 111, protecting the first photoresist features 111 from being dissolved by the solvent used during the step of forming second photoresist features.

Turning to FIG. 1B, the pitch of the photoresist features patterns is doubled by forming a second photoresist layer over the first photoresist features 111, followed by patterning the second photoresist layer to form second photoresist features 211. The second photoresist features 211 are also pillar-shaped, as illustrated by circles 2 in FIG. 2B. FIG. 1B is a side cross sectional view along line B-B in FIG. 2B. If desired, the first and second photoresist features 111 and 211 may optionally be trimmed to reduce their diameter.

The first and second photoresist materials may be any suitable photoresist material(s), preferably acrylate materials, such as poly(methyl acrylate) or poly(methyl methacrylate). The first and second photoresist materials may be same or different. For example, the second photoresist material may have a thinner viscosity than the first photoresist material.

In some embodiments, when the first photoresist is an acrylic material, the reactive reagent may be the same acrylic material with an active functional group on the side chain. The reactive reagent can be a chemical shrink material, such as CSX004, FZX F112 or FZX F114 which comprises a poly(methyl)acrylate derivative, melamine resin, and other ingredients including water, methyl isobutyl carbinol, n-butyl alcohol, or combinations thereof. For example, FZX F114 comprises a poly(methyl)acrylate derivative, and a solvent containing methyl isobutyl carbinol and n-butyl alcohol having a volume ratio of 70:30 to 90:10, such as a volume ratio of 80:20. CSX004, FZX F112 and FZX F114 are all available from JSR Micro (http://www.jsrmicro.com). Another chemical shrink material, RELACS® available from AZ Electronic Materials or other reactive reagents which are used in the prior art to reduce the dimensions of openings between adjacent resist patterns (i.e., which are used to widen small resist patterns), may also be used.

Other freezing methods may also be used to protect the first photoresist features 111 from being dissolved by solvent(s) used (i.e., to render the first photoresist features 111 insoluble) in the step of patterning the second photoresist layer. For example, a protective agent may selectively replace some functional groups of the first photoresist polymer, which in turn renders the first photoresist insoluble to the solvent(s). Alternatively, the first photoresist may crosslink with a compatible chemistry under a desired condition, such as an application of heat (e.g., a high temperature bake), or other desired treatments, to "freeze" the first photoresist features 111.

Figure 1C:
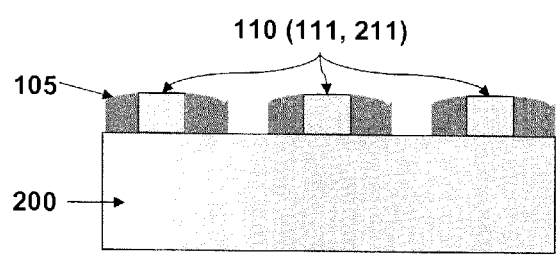
Figure 2C:
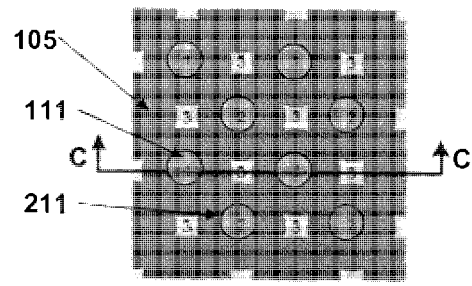

Next, spacer features 105 (e.g., a sidewall spacer) can be formed surrounding the first and second photoresist features 100 (111, 211), as shown in FIGS. 1C and 2C. Spacer features 105 may be formed by conventional sidewall spacer formation methods, such as by depositing a film over the photoresist features 110 and then anisotropically etching the film to leave the cylindrical spacer features 105 surrounding the photoresist features 110. The spacer features 105 may be made of a conductive, insulating or semiconductor material different from that of the photoresist features 110. For example, the spacer material, such as silicon oxide or silicon nitride, can be deposited by a low temperature CVD process on the photoresist features 110 and etched by wet etching methods. Of course, other suitable material combinations of the spacer features 105 and the photoresist features 110 may also be used. The step of forming the spacer features 105 exposes the sacrificial layer 200 in the openings 3, as shown in FIG. 2C. FIG. 1C is a side cross sectional view along line C-C in FIG. 2C.

Figure 1D:
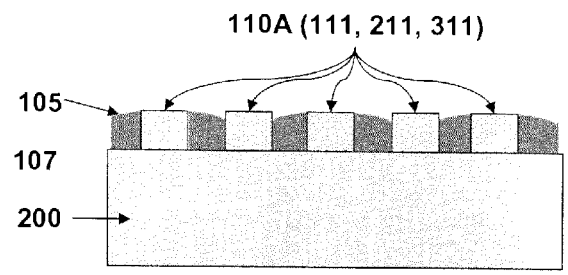

Turning to FIG. 1D, third photoresist features 311 can be formed in the openings 3 between the spacer features 105. The third photoresist features 311 can be formed by any suitable methods. In some embodiments, the third photoresist features 311 can be formed by applying a flowable layer of photoresist first such that it is planarized by filling the space between the spacer features 105 with a relatively planar surface. Alternatively, the photoresist layer may be chemically or mechanically planarized, such as by etchback or CMP, using the top surface of the spacer features 105 as a stop. The third photoresist features 311 may be pillar-shaped, as illustrated by shapes 3 in FIG. 2D. FIG. 1D is a side cross sectional view along line D-D in FIG. 2D. If desired, the photoresist features 110A (111, 211 and 311) may optionally be trimmed to round the third photoresist features 311 and reduce the diameter of photoresist features 111 and 211.

Figure 2D:
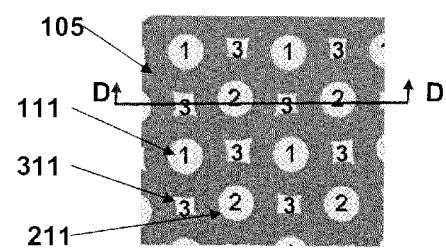

As shown in FIG. 2D, the first 111 and second 211 photoresist features (circles 1 and 2) have a cylindrical shape while the third photoresist features 311 (shapes 3) have a quasi-cylindrical shape. A quasi-cylindrical shape is a shape that has a cross section formed by four bordering annular spacer features 105. This shape has a cross section that is similar to a distorted circle, square or a rectangle depending on the distance between adjacent spacer features 105 and may include concave sidewalls which mirror the convex shape of the bordering spacer features 105.

Figure 1E:
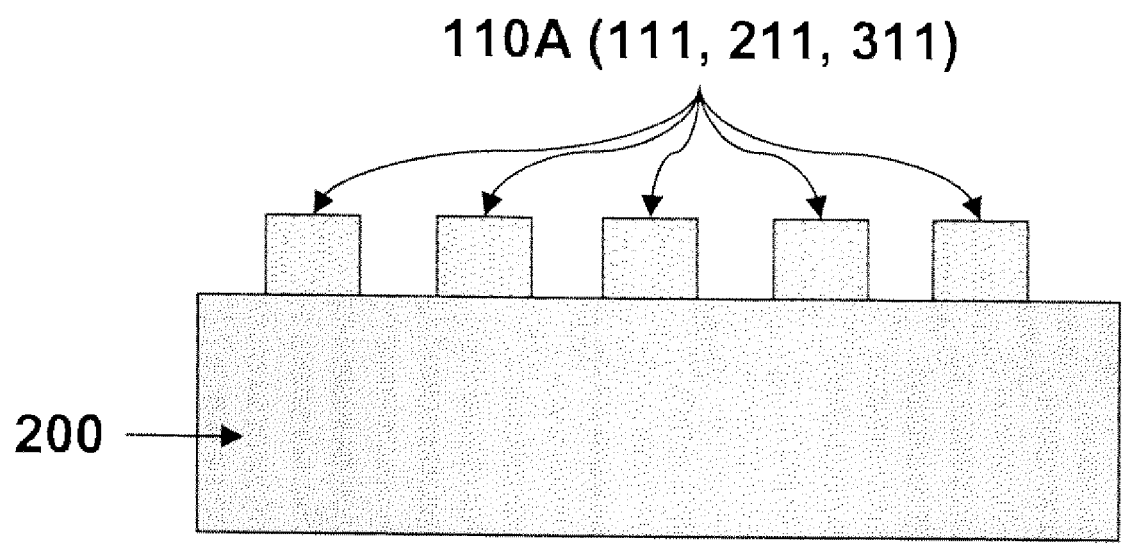

The spacer features 105 are then selectively removed, such as by selective etching, leaving the photoresist features 110A (111, 211, and 311) over the sacrificial layer 200, as shown in FIG. 1E. FIG. 1E is a side cross sectional view along line E-E in FIG. 2E.

Figure 2E:
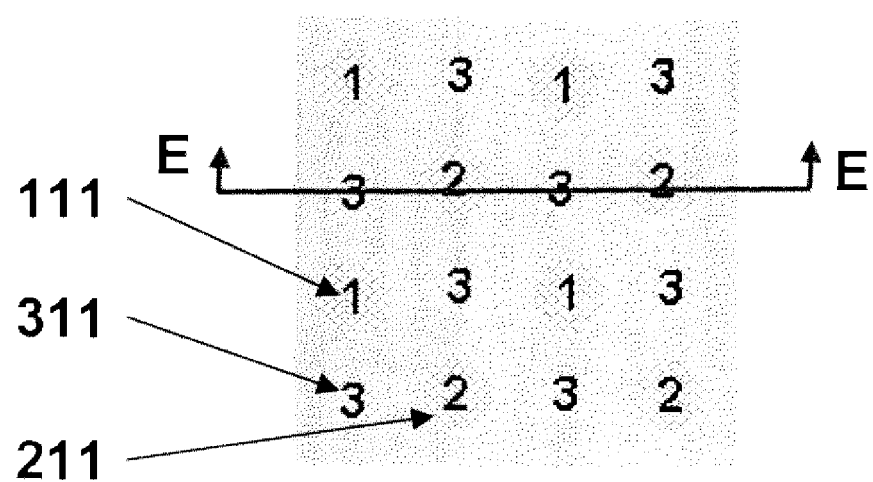

The first photoresist features 111 may be arranged in a repeating square pattern with one second photoresist feature 211 located in the middle of the imaginary square formed by first photoresist features 111 at each corner, and with a respective third photoresist feature 311 located at the center point of each imaginary line which makes up the sides of the imaginary square between the first photoresist features 111, as shown in FIG. 2E. Another way to describe this pattern is that first photoresist features 111 and the second photoresist features 211 form overlapping squares with the corner of each square of second photoresist feature 211 located in the middle of each square of first photoresist features 111 and vise-versa. The third photoresist features 311 form a rhombus having the first photoresist features 111 or the second photoresist features 211 in the center. Thus, the adjacent imaginary horizontal lines in FIG. 2E extend through alternating first 111 and third 311 photoresist features or second 211 and third 311 photoresist features, while adjacent imaginary diagonal lines extend through either third photoresist features 311 or alternating first 111 and second 211 photoresist features. Thus, the original pitch of photoresist features 111 and 211 has been doubled by adding the third photoresist features 311.

In some optional embodiments, one or more of bottom antireflective coating (BARC) layer (which can be an organic dielectric material) and/or dielectric antireflective coating (DARC) layer may be formed over the sacrificial layer the prior to forming the first photoresist features 111. Preferably, the BARC layer is formed over the DARC layer, which in turn is formed over the sacrificial layer 200. In these embodiments, the DARC layer is patterned using the combination of the first, second and third photoresist features as a mask, and the step of patterning the sacrificial layer uses at least the patterned DARC layer as a mask. The photoresist may be removed before or after patterning the DARC layer using the BARC layer as a mask.

Figure 3A:
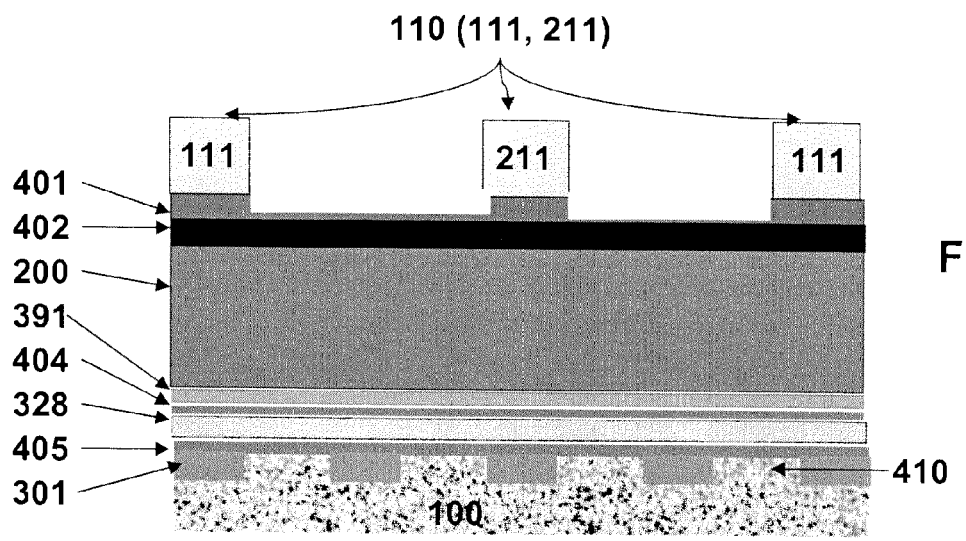
FIGS. 3A-3D are side cross-sectional views illustrating non-limiting examples of the method which is generally shown in FIGS. 1A-1E.

FIGS. 3A-3D illustrate non-limiting examples of the method which is generally shown in FIGS. 1A-1E. As shown in FIG. 3A, a DARC layer 402 (a 30-50 nm thick, such as 40 nm thick SiON layer) can be formed above the sacrificial layer 200 (100-150 nm thick, such as 150 nm thick amorphous carbon (a-C) and a BARC layer 401 (15-40 nm thick, such as 25 nm thick) can be formed above the DARC layer 402. The BARC layer 401 is etched using the photoresist features 110 (111 and 211) as a mask and thus the patterned BARC layer 402 adopts the pattern of the photoresist features 110, resulting in resist/BARC pillars shown in FIG. 3A. A thin p+ or n+ doped polysilicon seed layer 391 (5-15 nm thick, such as 10 nm thick) can be provided below the a-C sacrificial layer 200, and a switching material layer 328 (3-10 nm thick, such as 5 nm thick, which will be described in more detail below) can be located between two conductive layers 404 and 405, such as titanium and/or TiN layers (5-15 nm thick, such as 10 nm thick). The above described stack of layer is further located over rail-shaped bottom electrodes 301 separated by insulating material 410, which are located over a substrate 100. The photoresist features 110 (111 and 211) may comprise 193, 120 and 80 nm lithography resist. If the pitch of features 111 is 90-100 nm, such as 95-96 nm, then the same lithography mask may be shifted 45 nm (e.g., half pitch) in the X and Y directions to expose the second photoresist features 211. The final pitch of features 111 and 211 is about 64-68 nm. Of course other pitches may be used.

Figure 3B:
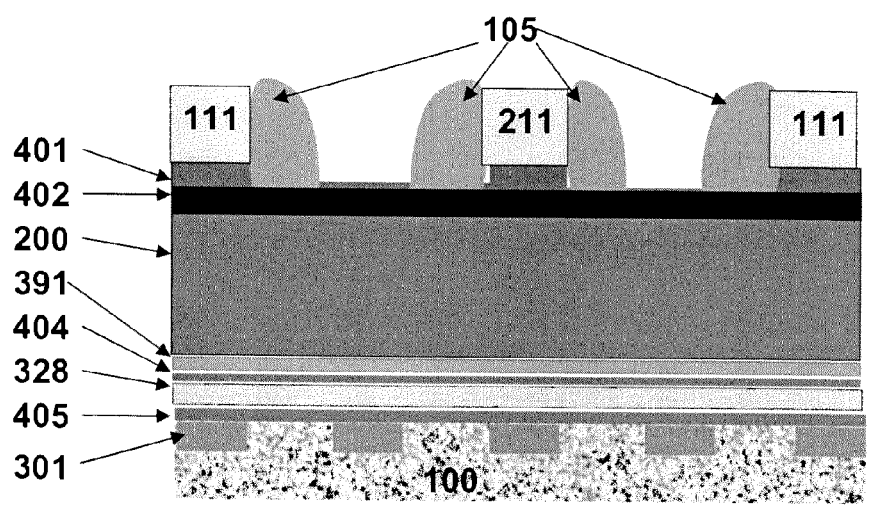
Figure 3C:
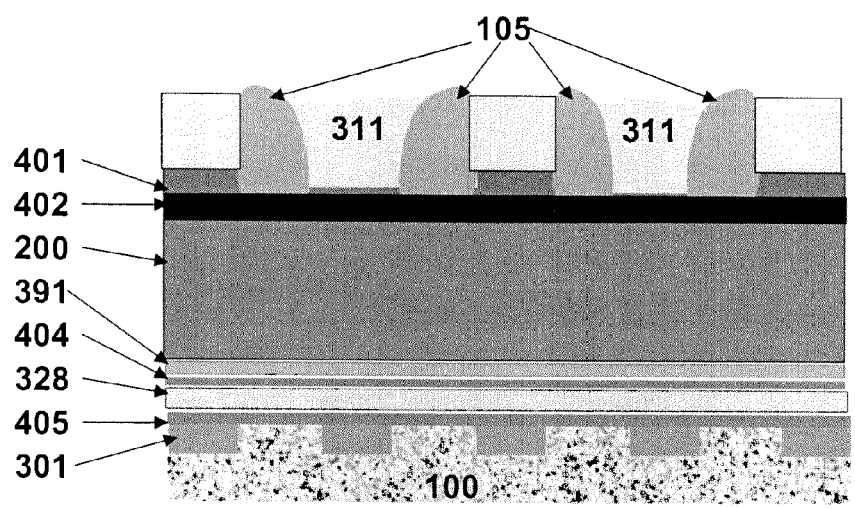
Figure 3D:

As shown in FIG. 3B, spacer features 105 can then be formed surrounding the photoresist features 111 and 211. The spacer features 105 may also extend around the patterned BARC layer 401. The third photoresist features 311 can then be formed by filling photoresist material over and between the spacer features 105, resulting in a structure as shown in FIG. 3C. Next, the spacer features 105 can be removed, leaving the photoresist features 110A (111, 211 and 311) over the DARC layer 402, as shown in FIG. 3D.

Figure 4A:
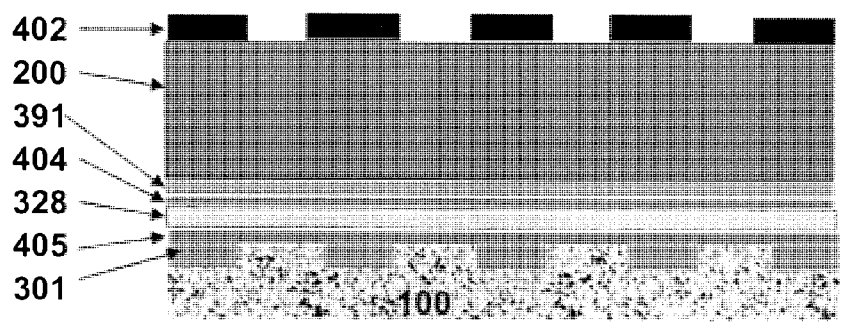
FIGS. 4A and 4C are side cross-sectional views illustrating a process flow of one embodiment.
Figure 4B:
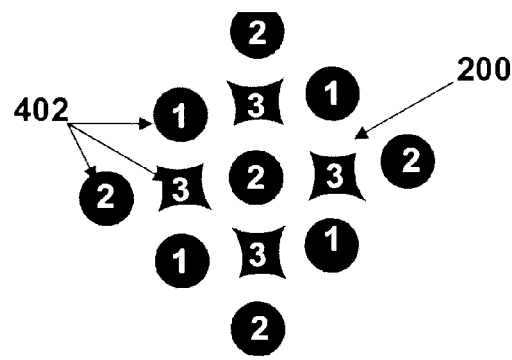
FIGS. 4B and 4D are top images of the structures shown in FIGS. 4A and 4C, respectively.

The DARC layer 402 is then etched using the photoresist features 110A (111, 211 and 311) as a mask. The BARC layer and the photoresist features may then be removed, resulting in a structure as shown FIG. 4A. The patterned DARC layer 402 adopts the pattern of the photoresist features 110A (111, 211 and 311). Thus, some of the DARC features (circles 1 and 2) have a cylindrical shape while other DARC features (shapes 3) have a quasi-cylindrical shape, as shown in FIG. 4B, which is a top image of the structure shown in FIG. 4A.

Figure 4C:
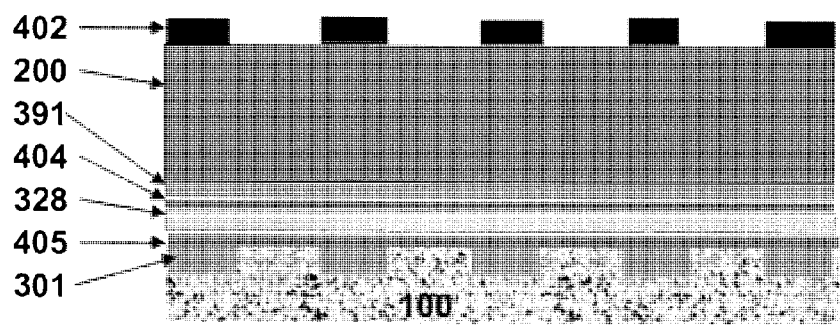
Figure 4D:
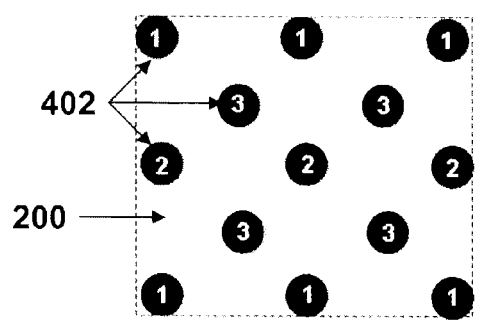

Next, the DARC features may be optionally trimmed to round the quasi-cylindrical features (shapes 3) and reduce the diameter of the cylindrical DARC features (circles 1 and 2), resulting in a structure as shown FIGS. 4C (side cross-sectional view) and 4D (top image).

Further, the a-C sacrificial layer 200 is then etched using the patterned DARC layer as a mask to form a-C sacrificial features 200A. If desired, the patterned BARC layer and/or the resist patterns 110A may be left in place over the patterned DARC layer during patterning of layer 200. The features 200A comprise cylindrical pillars. If the DARC trimming step is omitted, then some features 200A that are located in the location of features 311 have a quasi-cylindrical steps while the other features 200A have a cylindrical shape.

Figure 5A:
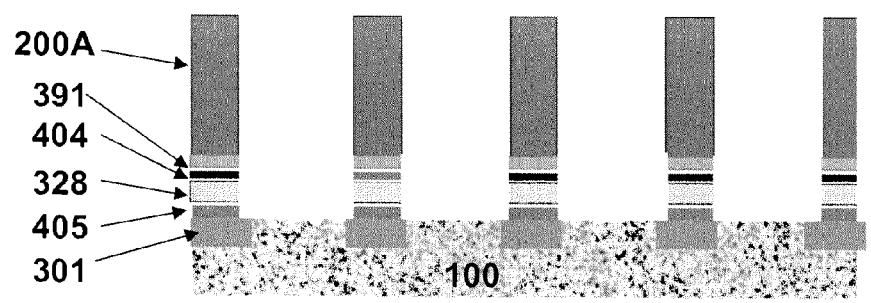
FIGS. 5A-5E are side cross-sectional views illustrating a process flow of one embodiment.

In this non-limiting example, the thin polysilicon seed layer 391, the switching material layer 328, and the two conductive layers 404 and 405 are also etched using the patterned DARC layer 402 and/or the a-C sacrificial features 200A as a mask. The etching of the a-C sacrificial layer 200, the thin polysilicon seed layer 391, the switching material layer 328, and the two conductive layers 404 and 405 stops on the insulating layer 410 which separates the rail shaped bottom electrodes 301. The DARC layer 402 is then removed, resulting in a structure shown in FIG. 5A.

Figure 5B:
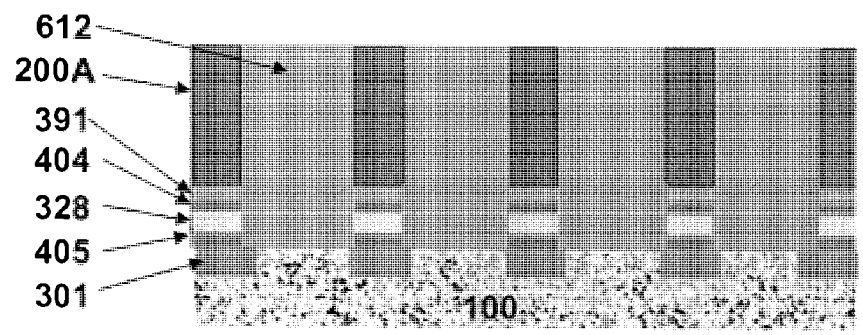

An insulating filler layer 612 is then formed between a-C sacrificial features 200A, resulting in a structure shown in FIG. 5B. The insulating filler layer 612 may comprise an optional silicon nitride liner on pillars 200A/391/404/328/405 (not shown) and a silicon oxide gap fill material filling the space between adjacent liner portions. Layer 612 may be formed over the a-C sacrificial features 200A followed by planarization by CMP with the tops of the a-C sacrificial features 200A. Preferably, the DARC layer 402 is completely removed prior to the step of removing a-C sacrificial features 200A. Residual DARC may impede the complete removal of the a-C features 402.

Figure 5C:
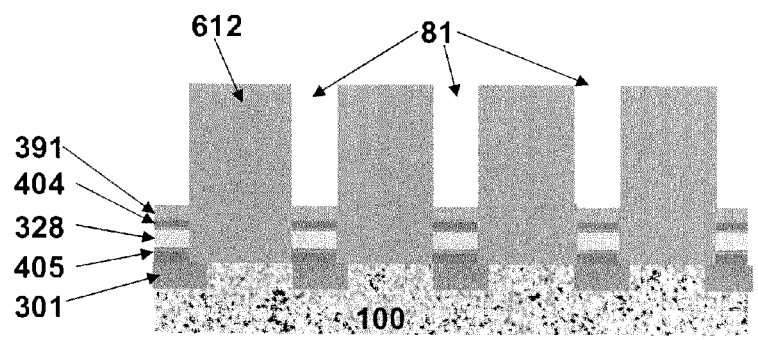
Figure 5D:
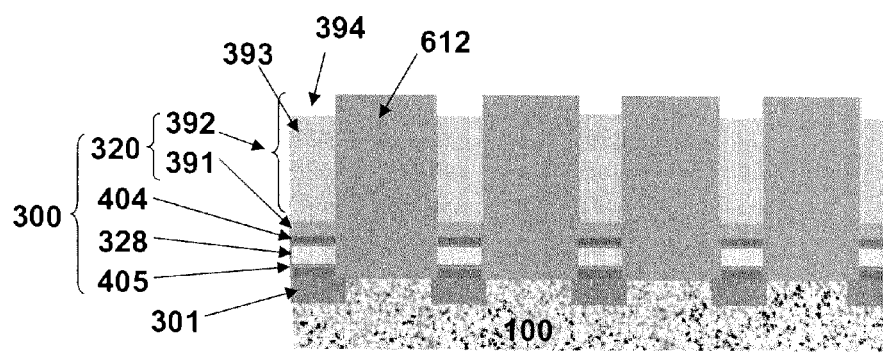

The sacrificial features 200 can then be removed, such as by selective etching or ashing, exposing the thin polysilicon seed layer 391 in the openings 81, as shown in FIG. 5C. The semiconductor features 392 can then be selectively deposited in the openings 81 over the seed material 391, resulting in a structure shown in FIG. 5D. The seed material 391 and the semiconductor features 392 may form diodes 320. Alternatively, the semiconductor features 392 may be deposited non-selectively followed by optional planarization, as will be described in more detail below. The diodes 320 may have a bottom heavily doped n-type region 391 (e.g., an n-type seed layer), an optional intrinsic region 393 (a region which is not intentionally doped), and a top heavily doped p-type region 394. The orientation of the diodes may be reversed. The diodes 320 may be formed by depositing intrinsic semiconductor material on the n-type or p-type seed material followed by implanting the other one of the n-type or p-type dopants into the upper portion of the semiconductor features 392. Alternatively, the upper regions of the p-i-n diodes may be formed by depositing a doped semiconductor material on the intrinsic semiconductor material. Other diodes, such as p-n diodes, punch through diodes, etc. may be formed instead of the p-i-n diodes.

In some embodiments, the diodes 320 are steering elements of non-volatile memory cells 300 and the switching material features 328 are storage elements of the non-volatile memory cells 300.

Figure 5E:
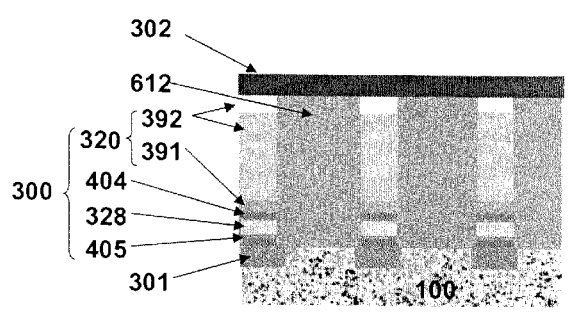
Figure 5F:
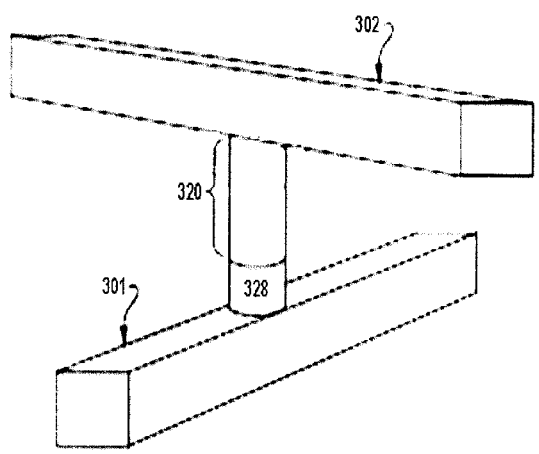
FIG. 5F is a perspective view of the structure shown in FIG. 5E.

The top electrodes 302 extending in a direction different (e.g., perpendicular) from that of the bottom electrodes 301 can then be formed over the non-volatile memory cells 300 by depositing one or more conductive layers which are then patterned into rails, as shown in FIGS. 5E (side cross-sectional view) and FIG. 5F (perspective view). The non-volatile memory cells 300 adopt the shape of the DARC features, and thus may have a cylindrical shape. Alternatively, if the DARC trimming step is omitted, then the cells 300 may have both the cylindrical and quasi-cylindrical shapes, as described above.

While specific device and sacrificial layers are described above, it should be noted that the device and sacrificial layers may be made of any suitable materials including insulating, semiconductor or a conductive layers. Also, one or more layers in the stack described above may be omitted if desired, for example the conductive layers 404 and 405 may be omitted in some embodiments.

In the above described embodiment, the storage element 328 is located below the diode steering element 320 in the resulting device. Alternatively, the storage element 328 may be located over the diode steering element 320. FIGS. 6A through 6E show side cross-sectional views illustrating stages in formation of such a device in an alternative embodiment.

Figure 6A:
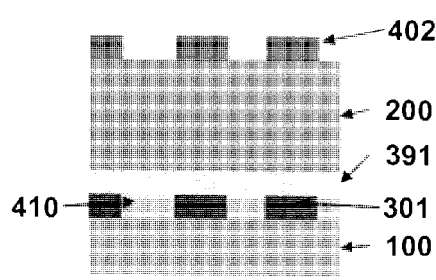
FIGS. 6A-6E are side cross-sectional views illustrating a process flow of an alternative embodiment.

Referring to FIG. 6A, the switching material layer 328 and the conductive layers 404 and 405 are not included in the initial stack. The DARC layer 402 is formed over the sacrificial layer 200. The DARC layer 402 is patterned using the method shown in FIGS. 1A-1E and 4A-4C.

Figure 6B:
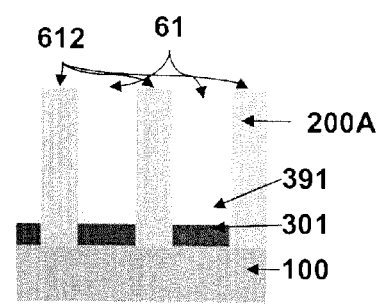

The sacrificial layer 200 is then patterned using patterned DARC layer 402 as a mask, followed by filling the openings between the sacrificial features with an insulating layer 612 and removing the sacrificial features 200A to leave openings as shown in FIGS. 5A-5D. The openings 61 in the insulating layer 612 are shown in FIG. 6B.

Figure 6C:
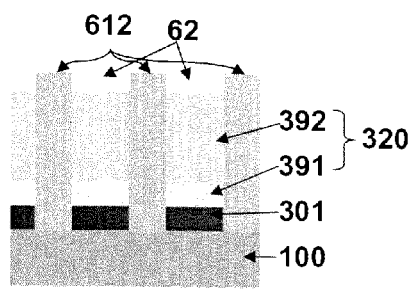

Semiconductor features 392 can then be formed by partially filling the openings 61, leaving recesses 62 over the semiconductor seed layer 391, resulting in a structure shown in FIG. 6C. The semiconductor features 392 can be formed by any suitable methods. For example, the semiconductor features 392 may be formed by selectively depositing the semiconductor material to partially fill the openings 61 in the insulating layer 612 to leave recesses 62 over the semiconductor features 392. Alternatively, the step of forming the semiconductor features 392 may comprise depositing semiconductor material to completely fill the openings 61 first, followed by a step of recessing the semiconductor material to form recesses 62 over the semiconductor features 392, as by selective etching. The semiconductor material may also optionally be deposited over the top of insulating layer 612 followed by planarization with the top of layer 612 by chemical mechanical polishing (CMP) or other suitable methods prior to the recessing etch step.

Figure 6D:
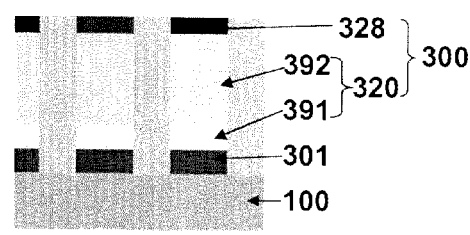

Next, switching material features 328 can then be formed over the semiconductor features 392 (e.g., over diodes 320), resulting in a structure shown in FIG. 6D. The switching material features 328 may be formed by depositing switching material in the recesses 62 and optionally over the top of layer 612 followed by optional planarization by CMP or other suitable methods using top of features 612 as a stop.

Figure 6E:
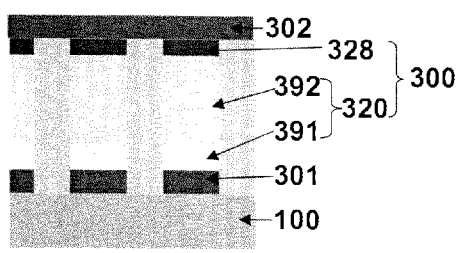
Figure 6F:
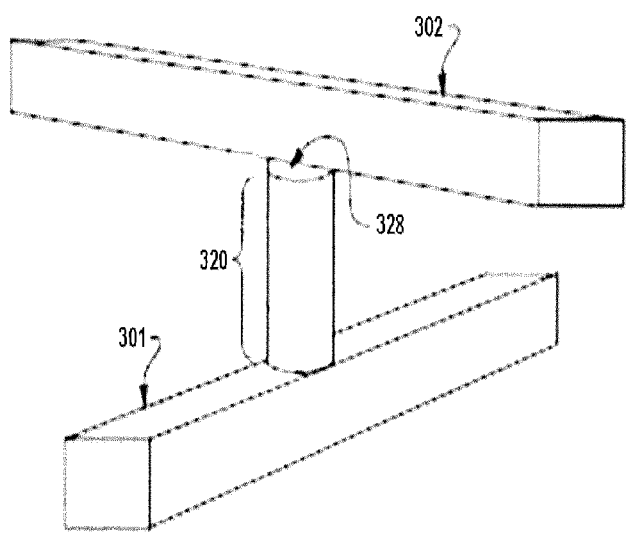
FIG. 6F is a perspective view of the structure shown in FIG. 6E.

Similarly, the top electrodes 302 can be formed over the non-volatile memory cells 300 extending to a direction different from that of the bottom electrodes 301, resulting in a structure shown in FIGS. 6E (side cross-sectional view) and FIG. 6F (perspective view). The perspective view of the resulting structure shown in FIG. 6F is substantially the same as that shown in FIG. 5F, except that the switching material 328 is located over, rather than under the diode 320.

As explained above, in some embodiments, the seed material 391 and the semiconductor features 392 may form diodes 320. In an alternative embodiment, the diodes 320 may be formed by non-selective deposition methods. In this embodiment, the seed material layer 391 may be omitted, and the semiconductor features 392 encompass the entire structure of diodes 320.

Figure 7A:
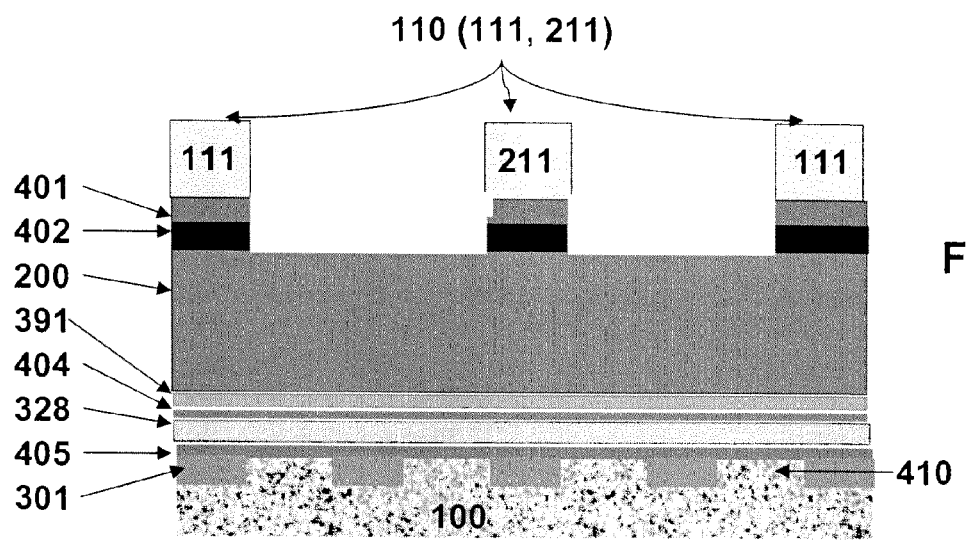
FIGS. 7A-7B are side cross-sectional views illustrating a process flow of an alternative embodiment.
Figure 7B:
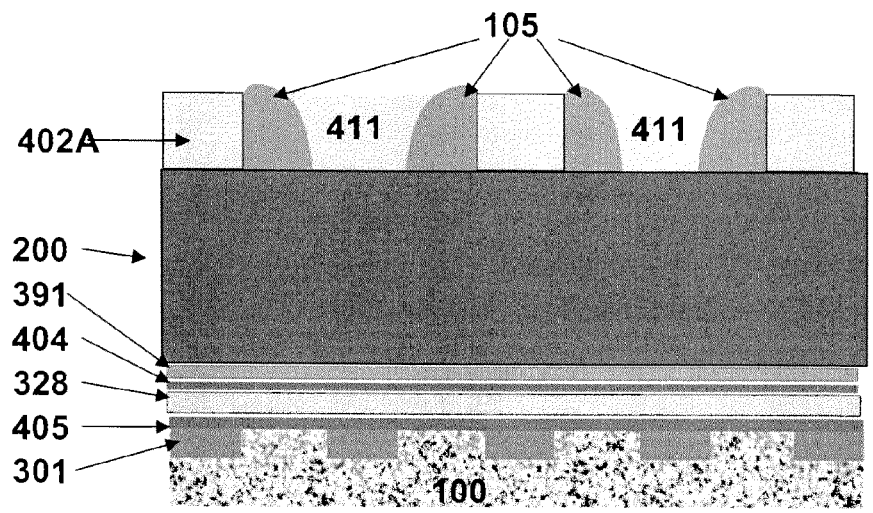

In another alternative embodiment shown in FIGS. 7A and 7B, rather than forming the spacer features 105 on the photoresist patterns 110, the spacer features are instead formed on the hard mask patterns.

As shown in FIG. 7A, the first and second photoresist features 111, 211 are used to as a mask to etch the BARC layer 401. Then, the photoresist features 111, 211 and/or the patterned BARC layer 401 are used as a mask to pattern the DARC layer 402, which serves as a hard mask layer, to form hard mask features 402A. Of course other hard mask layers may also be used instead or in addition to the DARC layer 402.

As shown in FIG. 7B, the photoresist features 111, 211 and optionally the patterned BARC layer 401 are removed from the hard mask features 402A. Then, the spacer features 105 are formed around the DARC hard mask features 402A by forming a spacer layer over the hard mask features and etching the spacer layer to form the spacer features and to expose the hard mask features.

Third masking features 411 are then formed between the spacer features 105. The third masking features 411 may comprise a photoresist material similar to that of features 311. Alternatively, features 411 may comprise any insulating, conductive or semiconductor material which allows selective etching of the spacer feature material without being etched away itself. Features 411 may comprise the same material as that of features 402A. For example, features 411 may comprise silicon oxynitride (SiON) features formed by depositing a SiON layer over the features 402A and 105 followed by planarization of this layer by CMP using tops of features 105 as a polish stop to leave features 411 in the space between the spacer feature 105.

Thereafter, the method proceeds in the same way as in FIGS. 4 and 5 or in FIGS. 4 and 6. Thus, the spacer features 105 are selectively removed and the sacrificial layer 200 is etched using the hard mask features 402 and the third masking features 411 as a mask to form sacrificial features 200A.

The substrate 100 can be any semiconducting substrate known in the art, such as monocrystalline silicon, IV-IV compounds such as silicon-germanium or silicon-germanium-carbon, III-V compounds, II-VI compounds, epitaxial layers over such substrates, or any other semiconducting or non-semiconducting material, such as glass, plastic, metal or ceramic substrate. The substrate 100 may include integrated circuits fabricated thereon, such as driver circuits for a memory device.

The conductive material of the electrodes 301 and 302 can independently comprise any one or more suitable conducting material known in the art, such as tungsten, copper, aluminum, tantalum, titanium, cobalt, titanium nitride or alloys thereof. For example, in some embodiments, tungsten is preferred to allow processing under a relatively high temperature. In some other embodiments, copper or aluminum is a preferred material.

The sacrificial layer 200 can be made of any suitable sacrificial materials, for example oxide or nitride materials or organic hard mask materials, including amorphous carbon. In some embodiments, the amorphous carbon material may be an advanced patterning film (APF).

The insulating material 612 can independently comprise any electrically insulating material, such as silicon oxide, silicon nitride, silicon oxynitride, or other high-k insulating materials.

Any suitable semiconductor materials can be used for semiconductor diodes 320, for example silicon, germanium, silicon germanium, or other compound semiconductor materials, such as III-V, II-VI, etc. materials. As explained above, the semiconductor material may be formed by any suitable selectively or non-selectively deposition methods. In one embodiment, the semiconductor material in at least one of the first and second device levels is selectively deposited by low pressure chemical vapor deposition (LPCVD). For example, the method described in U.S. application Ser. No. 12/216,924 filed on Jul. 11, 2008 or U.S. application Ser. No. 12/007,781 (published as US Published Application 2009/0179310 A1), incorporated herein by reference in their entirety, may be used to deposit polysilicon. Alternatively, the methods described in U.S. application Ser. No. 11/159,031 filed on Jun. 22, 2005 (which published as US Published Application 2006/0292301 A 1) and in U.S. application Ser. No. 12/007,780 filed on Jan. 15, 2008, incorporated herein by reference in their entirety, may be used to deposit the germanium. The semiconductor material may be amorphous, polycrystalline or single crystal. For example, the material may comprise polysilicon. The optional seed layer 391 may comprise any suitable semiconductor or silicide seed material which allows selective growth of the semiconductor materials of the diodes 320. For example, the seed layer 391 may comprise polysilicon to grow additional polysilicon 392 of the diodes 320.

The non-volatile memory cells 300 may be one-time programmable (OTP) or re-writable. The switching material 328 can be one of antifuse, fuse, metal oxide memory, switchable complex metal oxide, carbon nanotube memory, graphene resistivity switchable material, carbon resistivity switchable material (e.g., amorphous and/or polycrystalline carbon), phase change material memory, conductive bridge element, or switchable polymer memory. The antifuse dielectric layer can be one of hafnium oxide, aluminum oxide, titanium oxide, lanthanum oxide, tantalum oxide, ruthenium oxide, zirconium silicon oxide, aluminum silicon oxide, hafnium silicon oxide, hafnium aluminum oxide, hafnium silicon oxynitride, zirconium silicon aluminum oxide, hafnium aluminum silicon oxide, hafnium aluminum silicon oxynitride, zirconium silicon aluminum oxynitride, silicon oxide, silicon nitride, or a combination thereof.

The methods of forming one memory device level have been explained above. Additional memory levels can be formed above or below the memory device level described above to form a monolithic three dimensional memory array having more than one device levels. A monolithic three dimensional memory array is one in which multiple memory levels are formed above a single substrate, such as a wafer, with no intervening substrates. The layers forming one memory level are deposited or grown directly over the layers of an existing level or levels. In some embodiments, electrodes can be shared between memory levels; i.e. top electrode 302 shown in FIGS. 4F and 5H would serve as the bottom electrode of the next memory level. In other embodiments, an interlevel dielectric (not shown) is formed above the first memory level, its surface planarized, and construction of a second memory level begins on this planarized interlevel dielectric, with no shared conductors.

The foregoing details description has described only a few of the many possible implementations of the present invention. For this reason, this detailed description is intended by way of illustration, and not by way of limitations. Although certain supporting circuits and fabrication steps are not specifically described, such circuits and protocols are well known, and no particular advantage is afforded by specific variations of such steps in the context of practicing this invention Variations and modifications of the embodiments disclosed herein may be made based on the description set forth herein, without departing from the scope and spirit of the invention. It is only the following claims, including all equivalents, that are intended to define the scope of this invention.

What is claimed is:

1. A method of making a device, comprising:
    forming a first photoresist layer over a sacrificial layer;
    patterning the first photoresist layer to form first photoresist features;
    rendering the first photoresist features insoluble to a solvent;
    forming a second photoresist layer over the first photoresist features;
    patterning the second photoresist layer to form second photoresist features;
    forming a spacer layer over the first and second photoresist features;
    etching the spacer layer to form spacer features and to expose the first and second photoresist features;
    forming third photoresist features between the spacer features;
    removing the spacer features; patterning the sacrificial layer using the first, second and third photoresist features as a mask to form sacrificial features;
    forming an insulating filler layer between the sacrificial features; and
    removing the sacrificial features to form openings in the insulating filler layer.

2. The method of claim 1, wherein the step of forming third photoresist features between the spacer features comprises:
    forming a third photoresist layer between and over the spacer features; and
    planarizing the third photoresist layer using top of the spacer features as a stop.

3. The method of claim 1, wherein the openings in the insulating filler layer are pillar shaped, and at least some of the openings are cylindrical and others are quasi-cylindrical.

4. The method of claim 1, wherein the sacrificial layer comprises an inorganic hard mask material over an organic hard mask material.

5. The method of claim 4, wherein the step of patterning the sacrificial layer comprises etching the inorganic hard mask layer to form inorganic sacrificial features, trimming the inorganic hard mask sacrificial features, and etching the organic hard mask layer using the trimmed inorganic hard mask sacrificial features as a mask.

6. The method of claim 1, further comprising:
    providing a switching material layer below the sacrificial layer;

providing a semiconductor seed layer between the switching material layer and the sacrificial layer;
etching the semiconductor seed layer using the sacrificial features as a mask;
etching the switching material layer using the sacrificial features as a mask to form switching material features prior to the step of forming the insulating filler layer between the sacrificial features; and
forming semiconductor features in the openings in the insulating filler layer;
wherein:
the switching material features comprise storage elements of nonvolatile memory cells;
the etched semiconductor seed layer comprises lower portions of diodes;
the semiconductor features comprise upper portions of the diodes; and
the diodes comprise steering elements of the non-volatile memory cells.

7. The method of claim 1, wherein:
the step of rendering the first photoresist pattern insoluble to the solvent forms a barrier layer over the first photoresist pattern;
the barrier layer comprises a thin polymer film having a thickness of less than 10 mu which is disposed on a surface of first photoresist features, such that the sacrificial layer is exposed in area between first photoresist features; and
the barrier layer protects the first photoresist pattern from being dissolved by the solvent used during the step of patterning the second photoresist layer.

8. The method of claim 1, wherein:
the first photoresist layer comprises a first composition;
the second photoresist comprises a second composition;
the third photoresist comprises a third composition; and
the first, second and third compositions are the same.

9. The method of claim 1, wherein:
the first photoresist layer comprises a first composition;
the second photoresist comprises a second composition;
the third photoresist comprises a third composition; and
the first, second and third compositions are different from each other.

10. A method of making a device, comprising:
forming a sacrificial layer over a semiconductor seed layer;
forming a hard mask layer over the sacrificial layer;
forming a first photoresist layer over the hard mask layer;
patterning the first photoresist layer to form first photoresist features;
rendering the first photoresist features insoluble to a solvent;
forming a second photoresist layer over the first photoresist features;
patterning the second photoresist layer to form second photoresist features;
forming a spacer layer over the first and second photoresist features;
etching the spacer layer to form spacer features and to expose the first and second photoresist features;
forming third photoresist features between the spacer features;
removing the spacer features;
etching the hard mask layer using the first, second and third photoresist features as a mask to form hard mask features;
trimming the hard mask features;
etching the sacrificial layer using the hard mask features as a mask to form sacrificial features;
etching the semiconductor seed layer using the sacrificial features as a mask;
forming an insulating filler layer between the sacrificial features and between remaining portions of the etched semiconductor seed layer;
removing the sacrificial features to form openings in the insulating filler layer; and
forming semiconductor pillars in the openings over the remaining portions of the etched semiconductor seed layer.

11. The method of claim 10, wherein the step of forming third photoresist features between the spacer features comprises:
forming a third photoresist layer between and over the spacer features; and
planarizing the third photoresist layer using top of the spacer features as a stop.

12. The method of claim 10, wherein the semiconductor pillars and the remaining portions of the etched semiconductor seed layer form pillar shaped diodes.

13. The method of claim 12, wherein the first and second photoresist features comprise cylindrical pillars and the third photoresist features comprise quasicylindrical pillars.

14. The method of claim 10, wherein:
the first photoresist layer comprises a first composition;
the second photoresist comprises a second composition;
the third photoresist comprises a third composition; and
the first, second and third compositions are the same or different from each other.

15. The method of claim 10, wherein:
the step of rendering the first photoresist pattern insoluble to the solvent forms a barrier layer over the first photoresist pattern;
the barrier layer comprises a thin polymer film having a thickness of less than 10 nm which is disposed on a surface of first photoresist features, such that the hard mask layer is exposed in area between first photoresist features; and
the barrier layer protects the first photoresist pattern from being dissolved by the solvent used during the step of patterning the second photoresist layer.

16. The method of claim 10, further comprising:
providing a switching material layer below the semiconductor seed layer; and
etching the switching material layer using the sacrificial features as a mask to form switching material features prior to the step of forming the insulating filler layer;
wherein:
the switching material features comprise storage elements of nonvolatile memory cells;
the remaining portions of the semiconductor seed layer comprise lower portions of diodes;
the semiconductor pillars comprise upper portions of the diodes; and
the diodes comprise steering elements of the non-volatile memory cells.

* * * * *